United States Patent
Du

(10) Patent No.: US 10,991,441 B2
(45) Date of Patent: Apr. 27, 2021

(54) ERASE-WRITE CYCLING METHOD OF A FLASH DEVICE

(71) Applicant: Shanghai Huali Microelectronics Corporation, Shanghai (CN)

(72) Inventor: Hongliang Du, Shanghai (CN)

(73) Assignee: Shanghai Huali Microelectronics Corporation, Shanghai (CN)

(*) Notice: Subject to any disclaimer, the term of this patent is extended or adjusted under 35 U.S.C. 154(b) by 0 days.

(21) Appl. No.: 16/830,740

(22) Filed: Mar. 26, 2020

(65) Prior Publication Data

US 2021/0090668 A1    Mar. 25, 2021

(30) Foreign Application Priority Data

Sep. 23, 2019   (CN) .......................... 201910898039.2

(51) Int. Cl.
| | | |
|---|---|---|
| *G11C 16/12* | (2006.01) | |
| *G11C 16/34* | (2006.01) | |
| *G11C 16/14* | (2006.01) | |
| *G11C 29/56* | (2006.01) | |
| *G11C 29/50* | (2006.01) | |

(52) U.S. Cl.
CPC .......... *G11C 16/349* (2013.01); *G11C 16/12* (2013.01); *G11C 16/14* (2013.01); *G11C 29/50004* (2013.01); *G11C 29/56012* (2013.01)

(58) Field of Classification Search
CPC ....... G11C 16/349; G11C 16/12; G11C 16/14; G11C 29/50004; G11C 29/56012
See application file for complete search history.

(56) References Cited

U.S. PATENT DOCUMENTS

| | | | | |
|---|---|---|---|---|
| 5,321,699 A | * | 6/1994 | Endoh ................. | G11C 11/5628 365/185.17 |
| 5,410,511 A | | 4/1995 | Michiyama | |
| 5,539,688 A | * | 7/1996 | Yiu ........................ | G11C 16/10 365/185.13 |
| 5,675,546 A | * | 10/1997 | Leung ................... | G11C 29/02 365/201 |
| 5,812,458 A | * | 9/1998 | Gotou ................. | G11C 11/5621 365/185.23 |

(Continued)

FOREIGN PATENT DOCUMENTS

| | | |
|---|---|---|
| CN | 1474416 A | 2/2004 |
| CN | 101937713 A | 1/2011 |

(Continued)

OTHER PUBLICATIONS

Dec. 3, 2020—(CN) CNIPA First Search Report Appn 201910898039.2.

Primary Examiner — Mushfique Siddique
(74) *Attorney, Agent, or Firm* — Banner & Witcoff, Ltd.

(57) ABSTRACT

A flash device endurance test method is provided. A flash device to be tested, which has a plurality of memory cells, includes multiple ports with the same and different test conditions. The method includes connecting the ports of the same test condition to the same pulse generation unit, and connecting the ports of different test conditions to different pulse generation units; generating by all of the pulse generation units, synchronous pulse voltage signals of N cycles, wherein one time of erasing-writing of the flash device is considered to be one of the cycles; and testing threshold voltages of erasing and writing states in each cycle.

10 Claims, 4 Drawing Sheets

(56) References Cited

U.S. PATENT DOCUMENTS

| | | | |
|---|---|---|---|
| 5,901,082 A | 5/1999 | Chen et al. | |
| 6,087,190 A * | 7/2000 | Wan | G11C 29/44 |
| | | | 438/11 |
| 9,263,141 B2 * | 2/2016 | Chang | G11C 16/3418 |
| 10,481,992 B1 * | 11/2019 | Ginty | G06F 11/3058 |
| 2001/0015932 A1 * | 8/2001 | Akaogi | G11C 16/16 |
| | | | 365/230.03 |
| 2005/0052918 A1 * | 3/2005 | Dormans | G11C 16/0433 |
| | | | 365/222 |
| 2007/0047327 A1 * | 3/2007 | Goda | G11C 16/16 |
| | | | 365/185.29 |
| 2008/0239842 A1 | 10/2008 | Cha et al. | |
| 2010/0082884 A1 * | 4/2010 | Chen | G06F 3/0604 |
| | | | 711/103 |
| 2016/0209466 A1 * | 7/2016 | Coignus | G11C 29/50004 |

FOREIGN PATENT DOCUMENTS

| | | |
|---|---|---|
| CN | 102027548 A | 4/2011 |
| CN | 102420013 A | 4/2012 |
| CN | 105556609 A | 5/2016 |

\* cited by examiner

ERASE-WRITE CYCLING METHOD OF A FLASH DEVICE

CROSS-REFERENCES TO RELATED APPLICATIONS

This application claims priority to Chinese patent application No. CN 201910898039 filed on Sep. 23, 2019, and entitled "FLASH DEVICE ENDURANCE TEST METHOD", the disclosure of which is incorporated herein by reference in its entirety.

TECHNICAL FIELD

The present application relates to the field of semiconductor manufacturing, in particular to a flash device endurance test method.

BACKGROUND

In all flash device test items, endurance is a necessary test item for measurement of the reliability of the device. Endurance refers to a change trend of the threshold voltage of the device subject to thousands of times of writing and erasing, typically industry standard range from 100,000 to 10,000,000 programing-erasing cycles. In the conventional endurance test method, that is, erasing-writing-erasing-writing . . . -erasing-writing, the threshold voltage is measured after a specific number of times, and the character of endurance can be obtained from the trend of the threshold voltage.

During erasing and writing procedure in the conventional method, the first step is to connect each port to SMU (source measure unit) or PGU (pulse generation unit). As total amount of SMU and PGU is less than device pads, ports of same force value will be connected to one SMU or PGU. Because the voltage value need to be forced is different between erase and write, reconnection is needed before applying erase or write, as shown in FIG. 1, which is a schematic diagram of an erasing-writing cycle.

Taking the E-flash as an example, it shows the writing conditions in FIG. 2, and erasing conditions in FIG. 3. The use of a program for one time of a hardware connection requires about 0.1 seconds, an erasing operation requires about 6 milliseconds, and a writing operation requires about 2 milliseconds. Therefore, in an erasing-writing cycle, the hardware connection occupies most of the time. If the calculation is based on 100,000 times of erasing-writing cycles, the entire test process requires 5.5 hours.

Due to repeated erasing and writing, while the hardware connection, after which a corresponding voltage condition is applied, needs to be re-performed before each time of erasing or writing, in this process, the hardware connection occupies a lot of time, so it is necessary to propose a new flash device endurance test method to reduce test time.

BRIEF SUMMARY

In view of the defects of the prior art described above, an objective of the present disclosure is to provide a flash device endurance test method, to solve the problem in the prior art that a hardware connection occupies a lot of time because the hardware connection, after which a corresponding voltage condition is applied, needs to be re-performed before each time of erasing or writing.

In order to achieve the above objective and other related objectives, the present disclosure provides a flash device endurance test method. The method comprises at least the following steps: step 1: providing a flash device to be tested, the flash device comprising a plurality of memory cells, the plurality of memory cells comprising multiple ports of the same test condition or of different test conditions; step 2: connecting the ports of the same test condition to the same pulse generation unit, and connecting the ports of different test conditions to a pulse generation unit, respectively; step 3: generating, by the pulse generation units in step 2, synchronous pulse voltage signals of N cycles, respectively, wherein one time of erasing-writing of the flash device is considered to be one of the cycles; and step 4: testing threshold voltages of erasing and writing states of the flash device in each cycle, respectively.

In some examples, the memory cells contained in the flash device in step 1 are first to fourth memory cells, respectively.

In some examples, the plurality of ports in step 2 comprise: a CG1 terminal formed by a connection between control gates of the first and second memory cells; a CG2 terminal formed by a connection between control gates of the third and fourth memory cells; an SG1 terminal formed by a connection between selective gates of the first and second memory cells; an SG2 terminal formed by a connection between selective gates of the third and fourth memory cells; a CSL terminal formed by a connection between source terminals of the first to fourth memory cells; a BL1 terminal formed by a connection between drain terminals of the first and third memory cells; a BL2 terminal formed by a connection between drain terminals of the second and fourth memory cells; and a PW terminal formed by a connection between P-well terminals of the third and fourth memory cells.

In some examples, the SG1 terminal and the SG2 terminal in step 2 are connected to the same pulse generation unit; the PW terminal, the CG2 terminal, the BL1 terminal, and the CSL terminal are connected to the same pulse generation unit; and the CG1 terminal and the BL2 terminal are connected to one of the pulse generation units, respectively.

In some examples, the ports of the same test condition in step 2 are ports of the same test voltage; and the ports of different test conditions are ports of different test voltages.

In some examples, the synchronous pulse voltage signals in step 3 are square waveform pulse voltages.

In some examples, in the writing state of one of the cycles in step 3, a pulse voltage high-level applied to the CG1 terminal is 6 V; a pulse voltage low-level applied to the SG1 terminal and the SG2 terminal is −3.5 V; a pulse voltage low-level applied to the PW terminal, the CG2 terminal, the BL1 terminal, and the CSL terminal is −3.5V; and a pulse voltage high-level applied to the BL2 terminal is 1.08 V.

In some examples, in the erasing state of one of the cycles in step 3, a pulse voltage low-level applied to the CG1 terminal is −3.5 V; a pulse voltage high-level applied to the SG1 terminal and the SG2 terminal is 1.2 V; a pulse voltage high-level applied to the PW terminal, the CG2 terminal, the BL1 terminal, and the CSL terminal is 6 V; and a pulse voltage high-level applied to the BL2 terminal is 6 V.

In some examples, duration of one of the cycles in step 3 is 8 to 10 milliseconds.

In some examples, in one of the cycles in step 3, duration of the erasing state is 6 milliseconds, and duration of the writing state is 2 milliseconds.

In some examples, the N cycles in step 3 are 100,000 cycles.

In some examples, the flash device is an E-flash device.

As described above, the flash device endurance test method of the present disclosure has the following beneficial effects. In the present disclosure, all direct current signals in the conventional test method are converted into pulse signals, and the ports of the same test condition are connected to the same pulse generation unit, to perform N times of repeated erasing-writing by means of the characteristic of generating of synchronous periodic waveforms by the pulse generation units, thereby saving the test time, improving the test efficiency, and reducing the production and operation costs.

DETAILED DESCRIPTION

The implementations of the present disclosure are described below through specific embodiments. Those skilled in the art could easily understand other advantages and effects of the present disclosure through the contents disclosed in this specification. The present disclosure can also be implemented or applied through other different specific implementations, and various details in this specification can also be modified or changed based on different viewpoints and applications, without departing from the spirit of the present disclosure.

Please refer to FIGS. 2-6. It should be noted that the figures provided in this embodiment merely describe the basic idea of the present disclosure in a schematic manner. Therefore, only the components related to the present disclosure are shown in the figures, which are not drawn according to the number, shapes, and sizes of the components in the actual implementation. The pattern, number, and portion of each component in the actual implementation can be changed randomly, in actual implementation, and the component layout pattern may be more complicated.

Figure 7:
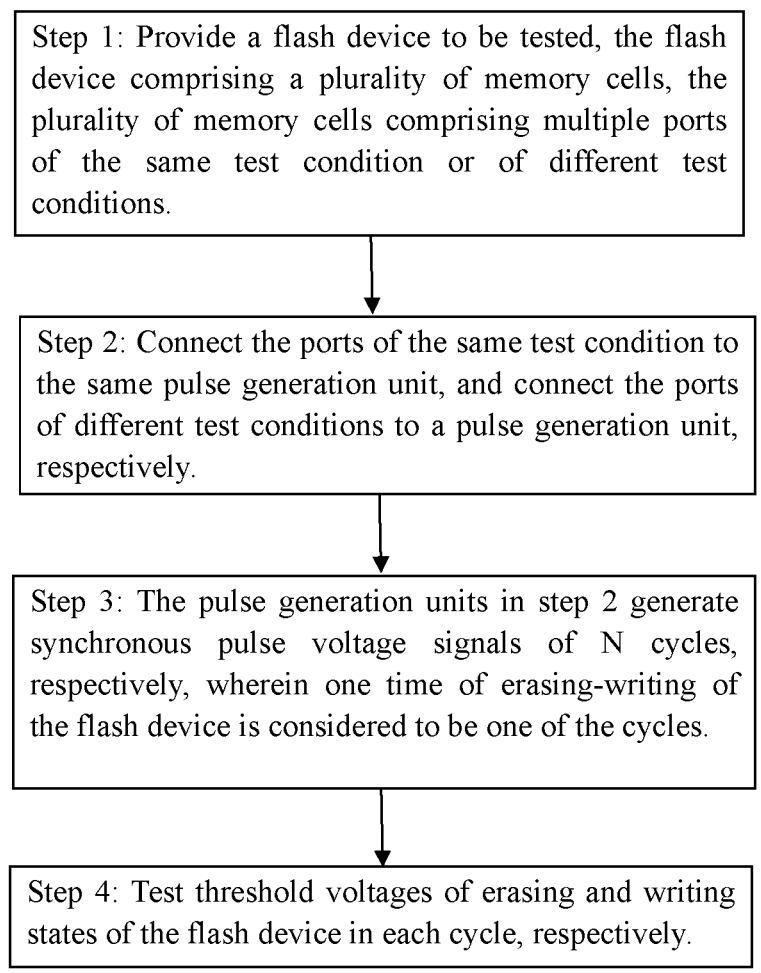
FIG. 7 is a schematic flowchart of a flash device endurance test method of the present disclosure.

The present application provides a flash device endurance test method. Referring to FIG. 7, FIG. 7 is a schematic flowchart of the flash device endurance test method of the present application. The method comprises the following steps in this embodiment.

Step 1: A flash device to be tested is provided, the flash device comprising a plurality of memory cells. Further, in the present application, the flash device of this embodiment is an E-flash device. The E-flash device to be tested is subject to a reliability/endurance test. The structure of the flash device of the present application comprises a plurality of memory cells. The E-flash device of this embodiment comprises a plurality of memory cells. Further, the memory cells contained in the flash device in step 1 are first to fourth memory cells, respectively, that is, the E-flash device of this embodiment comprises four memory cells, which are the first to fourth memory cells. Referring to a schematic view of a voltage condition for writing in an E-flash reliability test of the prior art in FIG. 2, the structure of the E-flash device of this embodiment is the same as that of the E-flash device of the prior art, and comprises the first memory cell T1, the second memory cell T2, the third memory cell T3, and the fourth memory cell T4. The structure of the E-flash device of the present application comprises but is not limited to the above-mentioned four memory cells involved in this embodiment.

Each of the first to memory cells of this embodiment comprises an NMOS transistor and a selective transistor connected to the NMOS transistor, and a gate (control gate) of the NMOS transistor in the first memory cell is connected to a gate (control gate) of the NMOS transistor in the second memory cell; a gate (selective gate) of the selective transistor in the first memory cell is connected to a gate (selective gate) of the selective transistor in the second memory cell; a gate (selective gate) of the selective transistor in the third memory cell is connected to a gate (selective gate) of the selective transistor in the fourth memory cell; and a gate (control gate) of the NMOS transistor in the third memory cell is connected to a gate (control gate) of the NMOS transistor in the fourth memory cell. A drain terminal of the NMOS transistor in the first memory cell is connected to a drain terminal of the NMOS transistor in the third memory cell, and both of the drain terminals are connected to a bit line BL1; a drain of the NMOS transistor in the second memory cell is connected to a drain of the NMOS transistor in the fourth memory cell, and both of the drain terminals are connected to a bit line BL2. A source terminal of the selective transistor in the first memory cell is connected to a source terminal of the selective transistor in the third memory cell; a source terminal of the selective transistor in the second memory cell is connected to a source terminal of the selective transistor in the fourth memory cell; and the source terminals of the selective transistors in the first to fourth memory cells are connected to each other to form a common source line (CSL) terminal.

Figure 1:
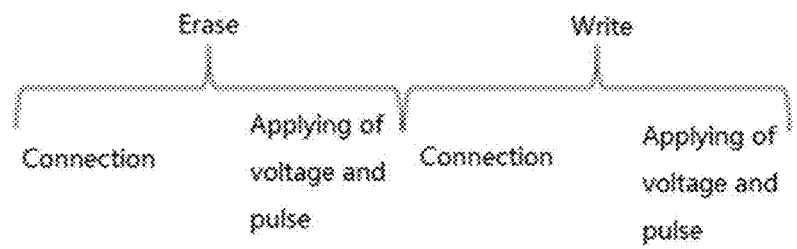
FIG. 1 is a schematic view of an erasing-writing cycle of the prior art.
Figure 2:
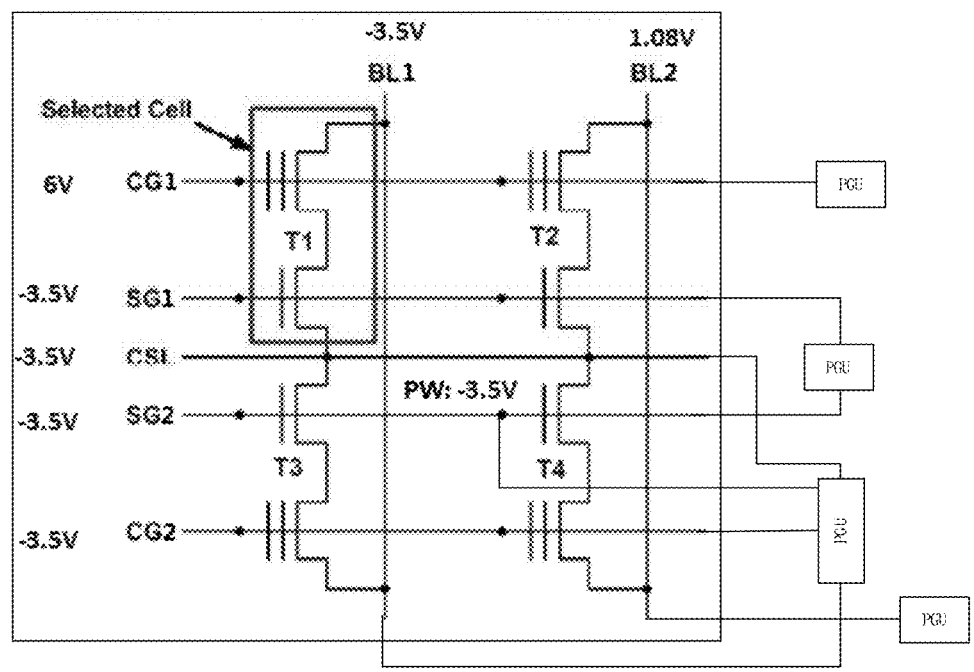
FIG. 2 is a schematic view of a voltage condition for writing in an E-flash reliability test of the prior art.
Figure 3:
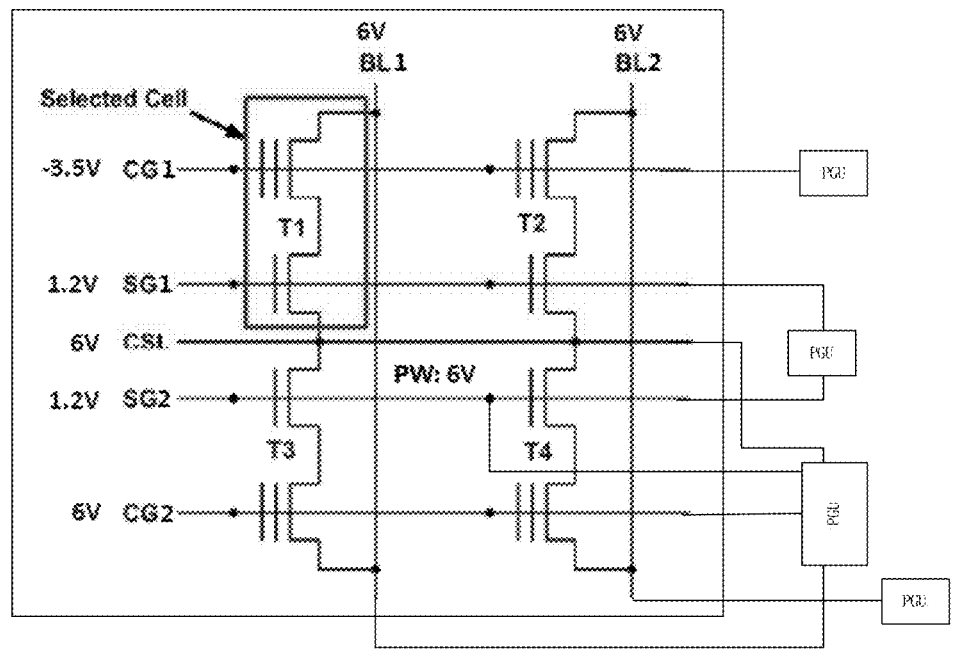
FIG. 3 is a schematic view of a voltage condition for erasing in an E-flash reliability test of the prior art.

Step 2: The plurality of memory cells comprise multiple ports of the same test condition or of different test conditions, wherein the ports of the same test condition are connected to the same pulse generation unit, and the ports of different test conditions are connected to a pulse generation unit, respectively. The four memory cells (the first to fourth memory cells) of this embodiment comprise multiple ports of the same test condition or of different test conditions. Referring to FIG. 2, the plurality of ports in step 2 comprise: a CG1 terminal formed by a connection between the control gates of the first and second memory cells; a CG2 terminal formed by a connection between the control gates of the third and fourth memory cells; an SG1 terminal formed by a connection between the selective gates of the first and second memory cells; an SG2 terminal formed by a connection between the selective gates of the third and fourth memory cells; a CSL terminal formed by a connection between the source terminals of the first to fourth memory cells; a BL1 terminal formed by a connection between the drain terminals (drain terminals of the NMOS transistors) of the first and third memory cells; a BL2 terminal formed by a connection between the drain terminals (drain terminals of the NMOS transistors) of the second and fourth memory cells; and a PW terminal formed by a connection between P-well terminals of the third and fourth memory cells.

In the CG1 terminal, the CG2 terminal, the SG1 terminal, the SG2 terminal, the CSL terminal, the BL1 terminal, the BL2 terminal, and the PW terminal in the E-flash device of this embodiment, the SG1 terminal and the SG2 terminal are connected to the same pulse generation unit; the PW terminal, the CG2 terminal, the BL1 terminal, and the CSL terminal are connected to the same pulse generation unit; and the CG1 terminal and the BL2 terminal are connected to one of the pulse generation units, respectively.

Further, in the present application, the ports of the same test condition in step 2 are ports of the same test voltage; and the ports of different test conditions are ports of different test voltages. In this embodiment, the ports of the same test voltage refer to that, in one erasing-writing cycle, these ports of the same test voltage need to receive the same voltage pulse at the same time, and ports of different test voltages need to receive synchronously changed voltage pulses at the same time.

Figure 4:
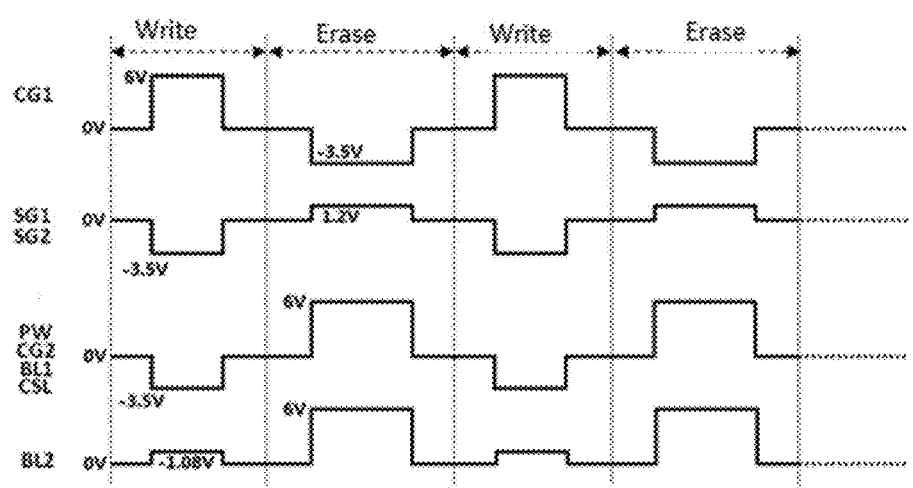
FIG. 4 is a schematic view of a voltage pulse waveform of each port in writing and erasing states of an E-flash reliability test of the present invention.

Step 3: The pulse generation units in step 2 generate synchronous pulse voltage signals of N cycles, respectively, wherein one time of erasing-writing of the flash device is considered to be one of the cycles. That is, in this embodiment, the pulse generation unit (PGU) connected to the SG1 terminal and the SG2 terminal, the pulse generation unit connected to the PW terminal, the CG2 terminal, the BL1 terminal, and the CSL terminal, the pulse generation unit connected to the CG1 terminal, and the pulse generation unit connected to the BL2 terminal generate the synchronous pulse voltage signals of N cycles, respectively, as shown in FIG. 4, which is a schematic view of a voltage pulse waveform of each port in writing and erasing states of an E-flash reliability test of the present application. The four pulse voltage signals are synchronous signals. Further, in the present application, the synchronous pulse voltage signals in step 3 of this embodiment are square waveform pulse voltages. Further, in the present application, as shown in FIG. 4, in the writing state of one of the cycles in step 3, a pulse voltage high-level applied to the CG1 terminal is 6 V; a pulse voltage low-level applied to the SG1 terminal and the SG2 terminal is −3.5 V; a pulse voltage low-level applied to the PW terminal, the CG2 terminal, the BL1 terminal, and the CSL terminal is −3.5V; and a pulse voltage high-level applied to the BL2 terminal is 1.08 V.

Referring to FIG. 4, in the erasing state of one of the cycles in step 3, a pulse voltage low-level applied to the CG1 terminal is −3.5 V; a pulse voltage high-level applied to the SG1 terminal and the SG2 terminal is 1.2 V; a pulse voltage high-level applied to the PW terminal, the CG2 terminal, the BL1 terminal, and the CSL terminal is 6 V; and a pulse voltage high-level applied to the BL2 terminal is 6 V.

Figure 5:
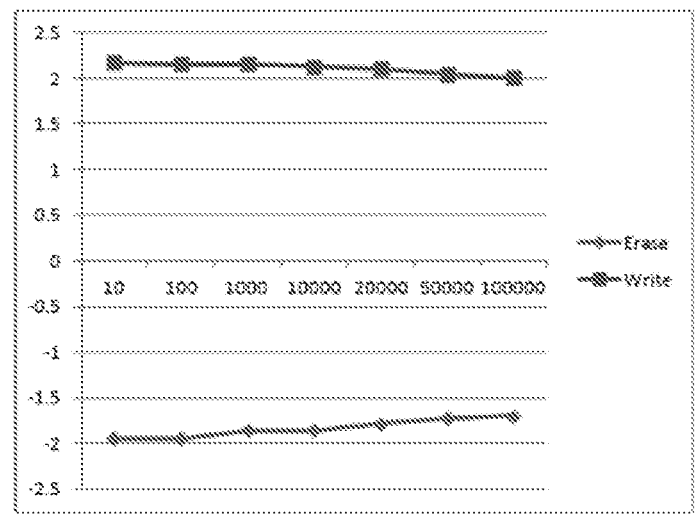
FIG. 5 is a schematic view of a threshold voltage test value in a state of 100,000 times of writing and erasing in the E-flash reliability test of the prior art.
Figure 6:
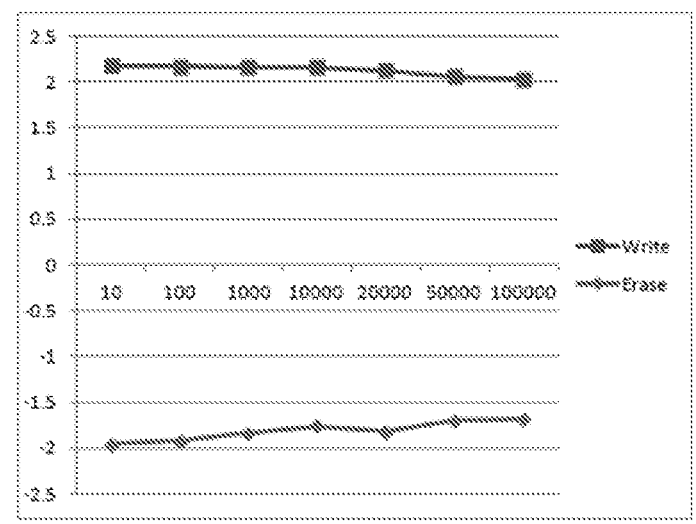
FIG. 6 is a schematic view of a threshold voltage test value in a state of 100,000 times of writing and erasing in the E-flash reliability test of the present disclosure.

Further, in the present application, duration of one of the cycles in step 3 is 8 to 10 milliseconds. In this embodiment, the duration of one of the cycles is 8 milliseconds, wherein duration of the erasing state is 6 milliseconds, and duration of the writing state is 2 milliseconds. In addition, the N cycles in step 3 are 100,000 cycles. Referring to FIGS. 5 and 6, FIG. 5 shows a threshold voltage test value in a state of 100,000 times of writing and erasing in the E-flash reliability test of the prior art; and FIG. 6 shows a threshold voltage test value in a state of 100,000 times of writing and erasing in the E-flash reliability test of the present application. It is found through a comparison that, in 100,000 test cycles, the threshold voltage values of the E-flash device obtained by using the test method of the present application are consistent with the threshold voltage values of said E-flash device obtained by using the test method of the prior art. It can be seen that test results obtained by using the test method of the present application are consistent with test results obtained by using the test method of the prior art. Therefore, the flash device endurance test method of the present application can completely replace the conventional tedious prior-art test method which requires repeated hardware connections. In the test method of the present application, a test time can be greatly shortened from 5.5 hours in the prior art to 20 minutes, which is equivalent to a 15-fold improvement in test efficiency.

To sum up, in the present application, all direct current signals in the conventional test method are converted into pulse signals, and the ports of the same test condition are connected to the same pulse generation unit, to perform N times of repeated erasing-writing by means of the characteristic of generating of synchronous periodic waveforms by the pulse generation units, thereby saving the test time, improving the test efficiency, and reducing the production and operation costs. Therefore, the present application effectively overcomes various defects in the prior art and thus has high industrial utilization value.

The above embodiments merely illustrate the principle and effect of the present application, but are not intended to limit the present application. Any person familiar with this technique could modify or change the above embodiments without departing from the spirit and scope of the present application. Therefore, all the equivalent modifications or changes made by those with ordinary knowledge in the technical field without departing from the spirit and technical ideas disclosed by the present application shall still be covered by the claims of the present application.

What is claimed is:

1. A flash device endurance test method, wherein the method comprises at least the following steps:
   step 1: providing a flash device to be tested, the flash device comprising a plurality of memory cells, wherein the memory cells are first to fourth memory cells, the plurality of memory cells comprising multiple ports of a same test condition or of different test conditions;
   step 2: connecting the ports of the same test condition to a same pulse generation unit, and connecting the ports of the different test conditions to different pulse generation units, wherein the multiple ports comprise: a CG1 terminal formed by a connection between control gates of the first and second memory cells; a CG2 terminal formed by a connection between control gates of the third and fourth memory cells; an SG1 terminal formed by a connection between selective gates of the first and second memory cells; an SG2 terminal formed by a connection between selective gates of the third and fourth memory cells; a CSL terminal formed by a connection between source terminals of the first to fourth memory cells; a BL1 terminal formed by a connection between drain terminals of the first and third memory cells; a BL2 terminal formed by a connection between drain terminals of the second and fourth memory cells; and a PW terminal formed by a connection between P-well terminals of the third and fourth memory cells,
   wherein the SG1 terminal and the SG2 terminal are connected to a first same pulse generation unit the PW terminal, the CG2 terminal, the BL1 terminal, and the CSL terminal are connected to a second same pulse generation unit and the CG1 terminal and the BL2 terminal are connected to the different pulse generation units;
   step 3: generating, by the pulse generation units in step 2, synchronous pulse voltage signals of N cycles, wherein one time of erasing-writing of the flash device is considered to be one of the cycles; and step 4: testing threshold voltages of erasing and writing states of the flash device in each cycle.

2. The flash device endurance test method according to claim 1, wherein the ports of the same test condition in step 2 are ports of a same test voltage; and the ports of the different test conditions are ports of different test voltages.

3. The flash device endurance test method according to claim 2, wherein the synchronous pulse voltage signals in step 3 are square waveform pulse voltages.

4. The flash device endurance test method according to claim 3, wherein in a writing state of one of the cycles in step 3, a pulse voltage high-level applied to the CG1 terminal is 6 V; a pulse voltage low-level applied to the SG1 terminal and the SG2 terminal is −3.5 V; a pulse voltage low-level applied to the PW terminal, the CG2 terminal, the BL1 terminal, and the CSL terminal is −3.5V; and a pulse voltage high-level applied to the BL2 terminal is 1.08 V.

5. The flash device endurance test method according to claim 4, wherein in an erasing state of one of the cycles in step 3, a pulse voltage low-level applied to the CG1 terminal is −3.5 V; a pulse voltage high-level applied to the SG1 terminal and the SG2 terminal is 1.2 V; a pulse voltage high-level applied to the PW terminal, the CG2 terminal, the BL1 terminal, and the CSL terminal is 6 V; and a pulse voltage high-level applied to the BL2 terminal is 6 V.

6. The flash device endurance test method according to claim 5, wherein in one of the cycles in step 3, a duration of the erasing state is 6 milliseconds and a duration of the writing state is 2 milliseconds.

7. The flash device endurance test method according to claim 3, wherein in an erasing state of one of the cycles in step 3, a pulse voltage low-level applied to the CG1 terminal is −3.5 V; a pulse voltage high-level applied to the SG1 terminal and the SG2 terminal is 1.2 V; a pulse voltage high-level applied to the PW terminal, the CG2 terminal, the BL1 terminal, and the CSL terminal is 6 V; and a pulse voltage high-level applied to the BL2 terminal is 6 V.

8. The flash device endurance test method according to claim 1, wherein a duration of one of the cycles in step 3 is 8 to 10 milliseconds.

9. The flash device endurance test method according to claim 1, wherein the N cycles in step 3 are 100,000 cycles.

10. The flash device endurance test method according to claim 1, wherein the flash device is an E-flash device.

* * * * *